(12) United States Patent
Daniel et al.

(10) Patent No.: US 7,088,624 B2
(45) Date of Patent: Aug. 8, 2006

(54) SYSTEM OF MULTIPLEXED DATA LINES IN A DYNAMIC RANDOM ACCESS MEMORY

(75) Inventors: Alan Daniel, Durham, NC (US); Christopher W. Kunce, Wake Forest, NC (US)

(73) Assignee: Infineon Technologies, A.G., Munich (DE)

( * ) Notice: Subject to any disclaimer, the term of this patent is extended or adjusted under 35 U.S.C. 154(b) by 112 days.

(21) Appl. No.: 10/623,078

(22) Filed: Jul. 18, 2003

(65) Prior Publication Data

US 2005/0013174 A1    Jan. 20, 2005

(51) Int. Cl.
*G11C 16/04* (2006.01)
(52) U.S. Cl. .......................... 365/189.02; 365/189.01; 365/230.04
(58) Field of Classification Search ........... 365/189.02, 365/189.01, 230.04, 230.02, 200
See application file for complete search history.

(56) References Cited

U.S. PATENT DOCUMENTS

| | | | | |
|---|---|---|---|---|
| 5,844,859 | A | * | 12/1998 | Iwamoto et al. |
| 6,385,100 | B1 | * | 5/2002 | Noda et al. |
| 6,711,067 | B1 | * | 3/2004 | Kablanian ............... 365/189.02 |
| 6,798,702 | B1 | * | 9/2004 | Tsuji .......................... 365/200 |

* cited by examiner

*Primary Examiner*—David Lam
(74) *Attorney, Agent, or Firm*—Brinks, Hofer, Gilson & Lione

(57) ABSTRACT

A system of multiplexed data lines in a DRAM integrated circuit includes a switching circuit having two switching states. In one switching state, the data lines connect to a first configuration of data paths as would occur in a typical DRAM integrated circuit. A limited number of spare column select lines are available to repair defective column select lines in the first configuration. In another switching state, the data lines connect to a second configuration of the data paths, doubling the number of spare column select lines available to repair a defective column select line.

11 Claims, 9 Drawing Sheets

SYSTEM OF MULTIPLEXED DATA LINES IN A DYNAMIC RANDOM ACCESS MEMORY

FIELD OF THE INVENTION

This invention relates to Dynamic Random Access Memory. More particularly the invention relates to a system of multiplexed data lines in a Dynamic Random Access Memory.

BACKGROUND

Many electronic devices and systems include integrated circuits for the storage of data during the operation of the devices. For example, electronic devices such as computers, printing devices, scanning devices, personal digital assistants, calculators, computer work stations, audio and/or video devices, communications devices such as cellular telephones, and routers for packet switched networks may include memory in the form of integrated circuits for retaining data as part of their operation. Advantages of using integrated circuit memory compared to other forms of memory include space conservation and miniaturization, conserving limited battery resources, decreasing access time to data stored in the memory, and cutting the costs of assembling the electronic devices.

Dynamic Random Access Memory ("DRAM") is an example of integrated circuit memory. DRAM typically comprises an array of semiconductor capacitor cells, each of which may hold an amount of electric charge that represents the logical value of a stored bit. The cells in the array are typically arranged in rows and columns. Each cell is situated at the intersection of a row and a column. Each cell in the DRAM array may be accessed by simultaneously addressing the intersecting row and column.

In operation, internal circuitry on the DRAM refreshes the charge on those cells that sense amplifiers have determined to already hold an electric charge. In this manner, the DRAM compensates for leakages of electric charge from the semiconductor capacitor cells, such as leakage into the substrate of the DRAM integrated circuit. Also, secondary sense amplifiers in the DRAM sense the amounts of electric charges stored on the capacitors. Based on the sensed electric charges, the outputs of the secondary sense amplifiers represent the logical values of the bits that are stored in the DRAM array. Data is written into the DRAM array and read out of the DRAM array through multiple read-write data lines. The read-write data lines connect the DRAM array to the input/output pins of the DRAM integrated circuit. The pins connect the DRAM integrated circuit to other integrated circuits in the electronic device. In this manner, the data stored in the DRAM array may be extracted from the DRAM integrated circuit for use by the other integrated circuits in the electronic device. Such reading, writing, and maintaining of charge on the cells are substantial internal operations of the DRAM.

Distinct sets of the read-write data lines typically connect to distinct portions of the DRAM memory array. Each of the memory portions also includes redundant memory cells that may substitute for damaged or failed memory cells within that memory portion. When all the redundant memory cells for a memory portion have been used as substitutes, however, further repair of the memory portion is not possible. Any additional damaged or failed memory cells in the memory portion cannot be repaired within that memory portion, resulting in corrupt or lost data on the read-write data lines and therefore a failed DRAM integrated circuit.

One possible solution to the problem is to increase the number of redundant memory cells in the memory portion. This solution, however, comes at the expense of an increase in the size of the die of the DRAM array as it has to accommodate many more memory cells. Therefore there is a need for repairing failed memory cells in a DRAM integrated circuit without increasing the size of the die of the DRAM array.

SUMMARY

In order to address the need for repairing failed memory cells in a DRAM array, a system is presented below for multiplexed data lines in a DRAM integrated circuit. The system includes a switching circuit having a first switching state and a second switching state. The system also includes a first data path associated with a first memory portion of the DRAM integrated circuit, and a second data path associated with a second memory portion of the DRAM integrated circuit. The system further includes a plurality of read-write data lines of the DRAM integrated circuit. The first data path is in communication with the plurality of read-write data lines when the switching circuit is in the first switching state. Also, the second data path is in communication with the plurality of read-write data lines when the switching circuit is in the second switching state.

The foregoing and other features and advantages of preferred embodiments will be more readily apparent from the following detailed description, which proceeds with reference to the accompanying drawings.

DETAILED DESCRIPTION OF THE PRESENTLY PREFERRED EMBODIMENTS

Figure 1:
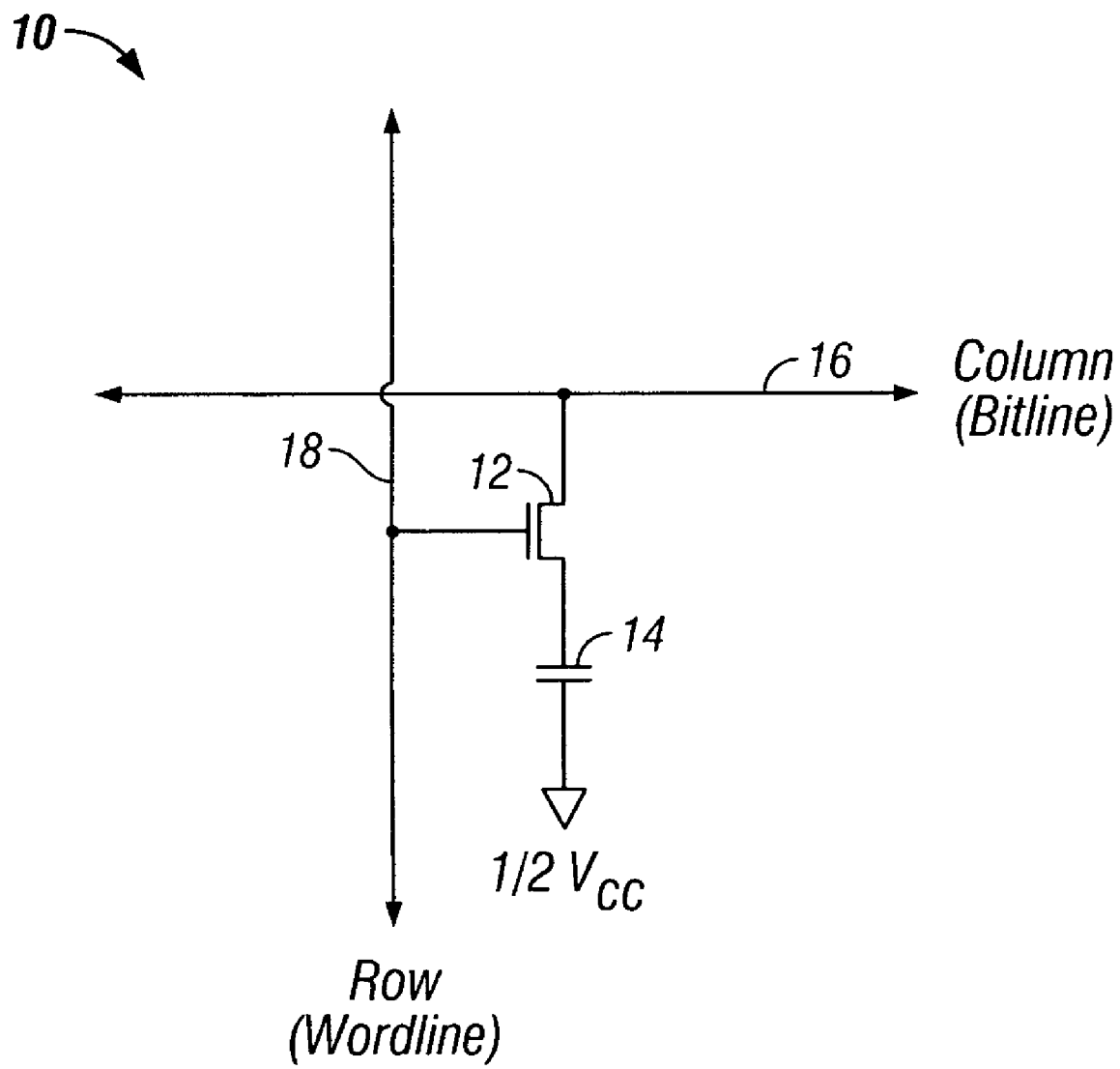
FIG. 1 is a diagram illustrating a preferred configuration of a memory cell in a DRAM array.

FIG. 1 is a diagram illustrating a preferred configuration of a memory cell 10 in a DRAM array. The memory cell 10 in this example includes an N-type metal oxide semiconductor ("MOS") transistor 12 and a capacitor 14. The transistor 12 and capacitor 14 may be formed on a substrate using fabrication techniques known to those of ordinary skill in the DRAM fabrication art. A first end of the MOS transistor 12 conduction path connects to a plate of the capacitor 14. A second end of the MOS transistor 12 conduction path connects to a column conduction path 16 that is common to all cells 10 that are associated in a column. For N-type MOS transistors 12, the end of the conduction path that is at a higher potential relative to the other end is commonly referred to as a "drain" by those of ordinary skill in the art, and the other end of the conduction path is commonly referred to as a "source."

he column conduction path 16 is often termed a "bitline" by those of ordinary skill in the DRAM fabrication art. The gate of the MOS transistor 12 connects to a row conduction path 18 that is common to all cells 10 that are associated in a row. The row conduction path 18 is often termed a "wordline" by those of ordinary skill in the DRAM fabrication art. It should be understood by one of ordinary skill in the art that the orientation of the rows and columns as shown in FIG. 1 are rotated by ninety degrees from the usual meaning of their orientation for the purpose of more fully describing the preferred embodiments to be described below.

The DRAM maintains the other plate of the capacitor 14 at a potential that is half the power supply voltage. The internal power supply voltage is referred to as $V_{CC}$ by those of ordinary skill in the art. Storing a logic value of one in the cell 10 includes raising the bitline 16 to a potential of $V_{CC}$ and raising the wordline 18 to a higher potential, $V_{CCP}$. $V_{CCP}$ is a potential that will enable the transistor 12 to conduct throughout the charging process. The transistor 12 conducts and the upper plate of the capacitor 14 is charged to a potential of $V_{CC}$. Storing a logic value of zero in the cell 10 includes lowering the bitline 16 to a potential of zero and raising the wordline 18 to $V_{CCP}$. The transistor 12 conducts and the upper plate of the capacitor 14 is discharged to zero potential through the transistor 12.

Reading the logic value stored in the cell 10 includes raising the potential on the wordline 18 to $V_{CCP}$. The transistor 12 conducts, transferring charge between the capacitor 14 and the bitline 16. A sense amplifier (not shown) detects a change in potential of the bitline 16, amplifies the change, and provides an output representative of the logic value that was stored in the memory cell 10. In a preferred embodiment of the memory cell 10, the bitline 16 is pre-charged to a potential of $\frac{1}{2}V_{CC}$ before the wordline 18 potential rises to initiate the reading process. If a logic value of one was stored in the cell 10, the potential on the upper plate of the capacitor 14 is expected to be greater than $\frac{1}{2}V_{CC}$, having fallen from $V_{CC}$ due to leakage. In this case, the potential on the bitline 16 will rise slightly from $\frac{1}{2}V_{CC}$. Alternatively, if a logic value of zero was stored in the cell 10, the potential on the upper plate of the capacitor 14 is expected to be less than $\frac{1}{2}V_{CC}$, having risen from zero due to leakage. In this case, the potential on the bitline 16 will fall slightly from $\frac{1}{2}V_{CC}$. The sense amplifier detects the slight rise or fall of potential on the bitline 16 and outputs a potential corresponding to a logic value of one or zero accordingly.

Figure 2:
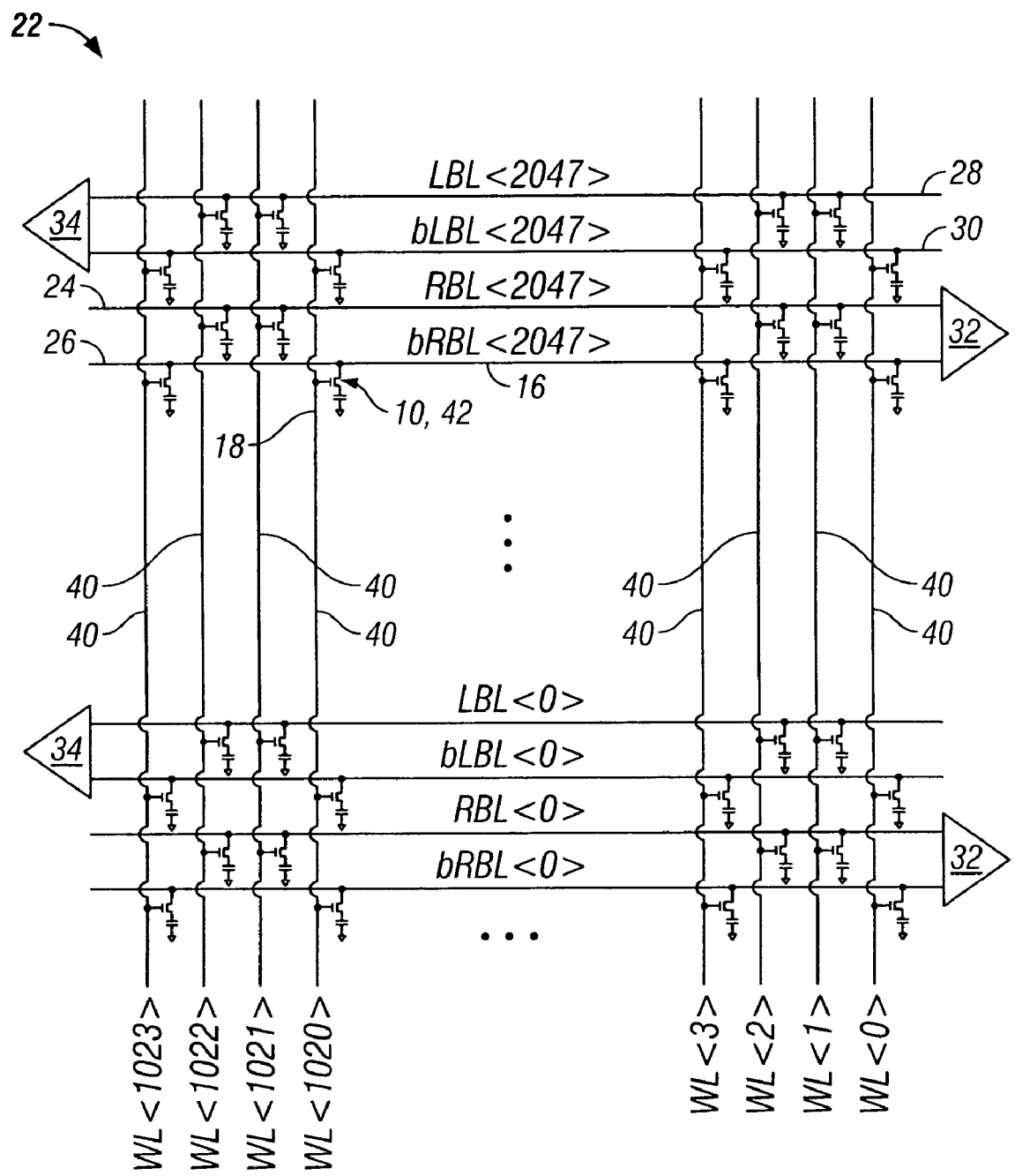
FIG. 2 is a diagram illustrating a preferred configuration of a memory section of a DRAM array.

FIG. 2 is a diagram illustrating a preferred configuration of a memory section 22 of a DRAM integrated circuit. An example of a DRAM integrated circuit is a sixty-four Megabit ("Mb") DRAM array, where one Megabit is $2^{20}$ bits or 1,048,576 bits. FIG. 2 illustrates a 4 Mb memory section 22 of the DRAM array, sixteen of which comprise the 64 Mb DRAM integrated circuit. The memory section 22 may have a left neighboring section (not shown) and a right neighboring section (not shown). Sections 22 at the edge of the die of the DRAM integrated circuit ordinarily lack a left or right neighboring section. It should be understood that the DRAM array of the present invention is not restricted to the configuration of memory cells 10 in the DRAM array as depicted in FIG. 2 and that other configurations of the DRAM array are possible. For example, each crossing of a bitline 16 and a wordline 18 may be connected to a memory cell 10.

Dividing the DRAM integrated circuit into memory sections 22 provides shorter bitlines and/or wordlines than if the lines ran across the whole DRAM array. Long lines may have large resistances, internal parasitic capacitances, and parasitic capacitances with neighboring lines that reduce the performance of the DRAM array. It should be understood, however, that the exemplary memory sizes of 64 Mb DRAM arrays and 4 Mb sections 22 are for illustrative purposes only and that other array and section sizes are contemplated.

In a preferred arrangement of bitlines within the section 22, alternate pairs of bitlines exit the section 22 in opposing directions. One selection of bitlines exits the section 22 to the right of the section 22. These bitlines are termed 'right bitlines' 24 ("RBLs") and 'right complementary bitlines' 26 ("bRBLs") by those of ordinary skill in the art. Another selection of bitlines exits the section 22 to the left of the section 22. These bitlines are termed 'left bitlines' 28 ("LBLs") and 'left complementary bitlines' 30 ("bLBLs"). Each RBL 24 and bRBL 26 connects to a sense amplifier 32, termed a 'right sense amplifier' 32 by those of ordinary skill in the art. Each LBL 28 and bLBL 30 connects to a sense amplifier 34, often termed a 'left sense amplifier' 34 by those of ordinary skill in the art. Bitlines paired with complementary bitlines are termed 'bitline pairs' by those of ordinary skill in the art. Those of ordinary skill in the art call the memory section 22 shown in FIG. 2 a 'folded digitline' configuration. The sense amplifiers 32, 34 detect the charges on the memory cells 10, amplify the corresponding potential differences on the bitline pairs, and write the amplified potential back on the memory cells 10 to refresh the charges on the memory cells 10.

In a preferred embodiment of the DRAM array, neighboring memory sections 22 share common sense amplifiers 32, 34. For example, RBLs 24 and bRBLs 26 of the section 22 share sense amplifiers 32 with the LBLs 28 and bLBLs 30 of the right neighboring section. Also, LBLs 28 and bLBLs 30 of the section 22 share sense amplifiers 34 with the RBLs 24 and bRBLs 26 of the left neighboring section. This sharing of sense amplifiers 32, 34 cuts the number of required sense amplifiers 32, 34 for the DRAM array by a factor of approximately two. If the DRAM array does not activate more than one wordline 40 in neighboring sections 22 at a time, the sense amplifiers 32, 34 do not encounter ambiguities regarding from which section 22 they are reading.

The memory section 22 includes wordline drivers (not shown), which raise the potential on the gates of the transistors 12 in a row substantially to $V_{CCP}$ for reading, writing, or refreshing the memory cells 10 in the memory section 22. The memory section 22 also includes write drivers (not shown) for raising or lowering the potentials on the bitlines 36 that charge the capacitors 14 of memory cells 10 to potentials corresponding to logic values of one or zero.

In the memory section 22 shown in FIG. 2, a memory cell 10 connects to alternate crossing points of a wordline 40 and a bitline 24–30. The exemplary 4 Mb memory section 22 comprises 1024 wordlines 40, labeled WL<0> to WL<1023>. The memory section 22 also comprises 8192 bitlines 24–30, themselves comprising 2048 quartets of bitlines 24–30. Each quartet includes: a LBL 28, the 2048 LBLs 28 being labeled LBL<0> to LBL<2047>; a bLBL 30, the 2048 bLBLs 30 being labeled bLBL<0> to bLBL<2047>; a RBL 24, the 2048 RBLs 24 being labeled RBL<0> to RBL<2047>; and a bRBL 26, the 2048 bRBLs 26 being labeled bRBL<0> to bRBL<2047>.

In operation, a memory cell 10, for example memory cell 42 at the juncture of WL<1020> and bRBL<2047>, stores a logic value. In order to refresh the logic value stored in this memory cell 42, the right sense amplifier 32 detects a difference in potentials between the RBL 24 at RBL<2047> and its complement bRBL 26 at bRBL<2047> when potential of the wordline 40 at WL<1020> is raised to detect the stored logic value from the cell 42. The right sense amplifier 32 amplifies the potential difference and increases the potential difference between RBL<2047> and bRBL<2047> to refresh the charge on memory cell 42. As is known to those of ordinary skill in the art, the arrangement of measuring the difference in voltage between complementary bitlines 24, 26 reduces noise at the sense amplifier 32 and improves the efficiency of the refreshing process on the DRAM integrated circuit.

Reading From and Writing to the DRAM Array

Figure 3:
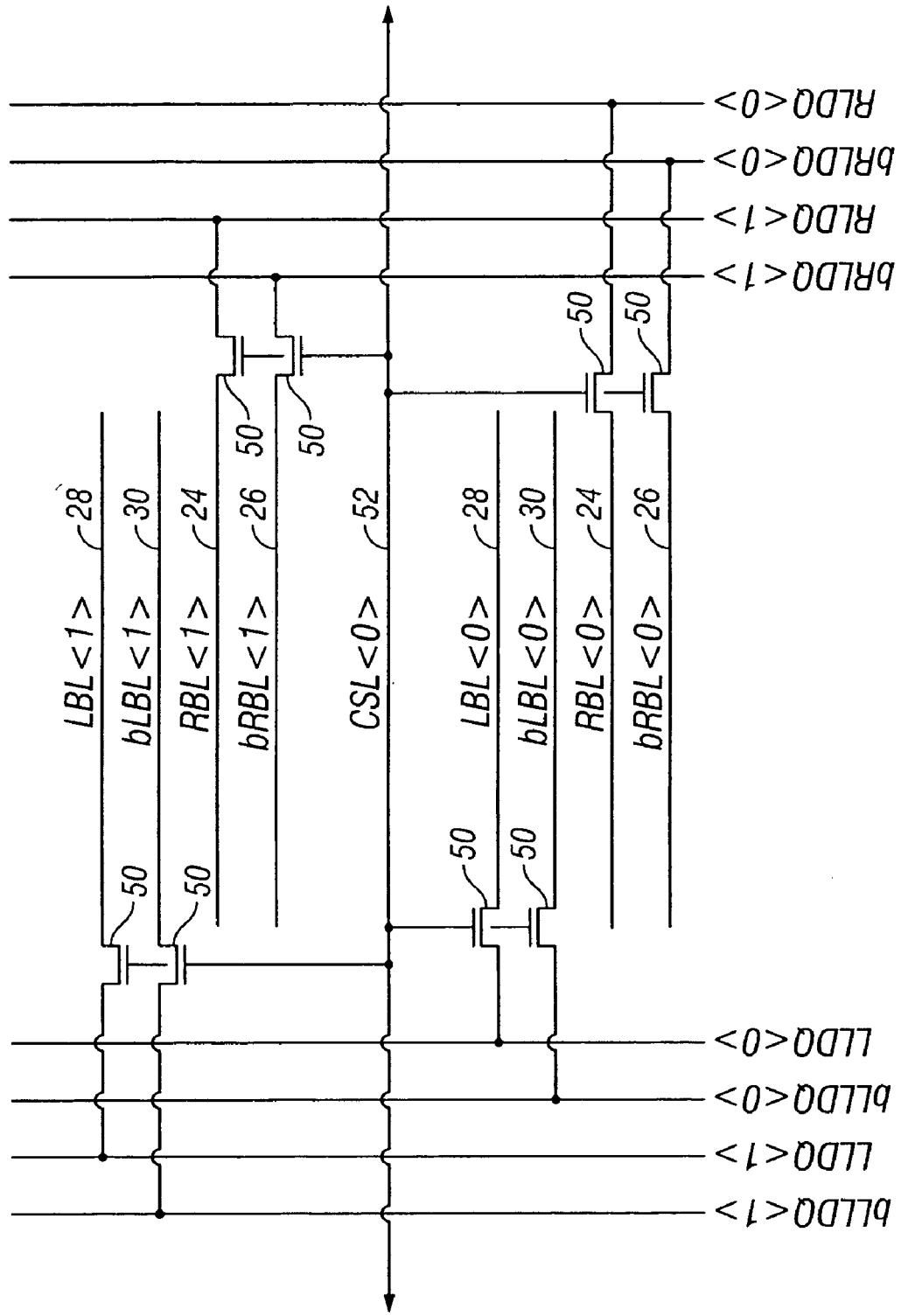
FIG. 3 is a diagram illustrating the connection between a column select line and the bitlines of FIG. 2.

FIG. 3 is a diagram illustrating the connection between a "column select line" ("CSL") 52 and the bitlines 24–30 of FIG. 2. In one preferred embodiment, a CSL opens two RBLs 24, two LBLs 28, two bRBLs 26, and two bLBLs 30 for reading data from or writing data to the memory section 22. Raising the potential on the CSL 52 turns on pass transistors 50, which connect the bitlines 24, 28 and complementary bitlines 26, 30 to "local data lines" ("LDQs"). Each LDQ and its complementary LDQ ("bLDQ") connect to secondary sense amplifiers ("SSAs")(not shown), which amplify the potential difference between the LDQ and bLDQ, corresponding to the potential difference between the associated bitline and complementary bitline, to read the stored logic value on the memory cells 10.

Alternatively, when the pass transistors 50 are conducting, a LDQ or bLDQ may be raised to $V_{CC}$ to write a logic value of one to a corresponding memory cell 10 or lowered to zero potential to write a logic value of zero. As a single wordline activates the memory cells 10 connected to either bitlines or complementary bitlines, as can be seen with reference to FIG. 2, the configuration depicted in FIG. 3 reads or writes four bits from the memory section 22 during the activation of one CSL 52 and one WL 40.

In the configuration shown in FIG. 3, the LBLs 28 connect to a left LDQ ("LLDQ"), the bLBLs 30 connect to a complementary LLDQ ("bLLDQ"), the RBLs 24 connect to a right LDQ ("RLDQ"), and the bRBLs 26 connect to a complementary RLDQ ("bRLDQ") through the pass transistors 50.

Figure 4:
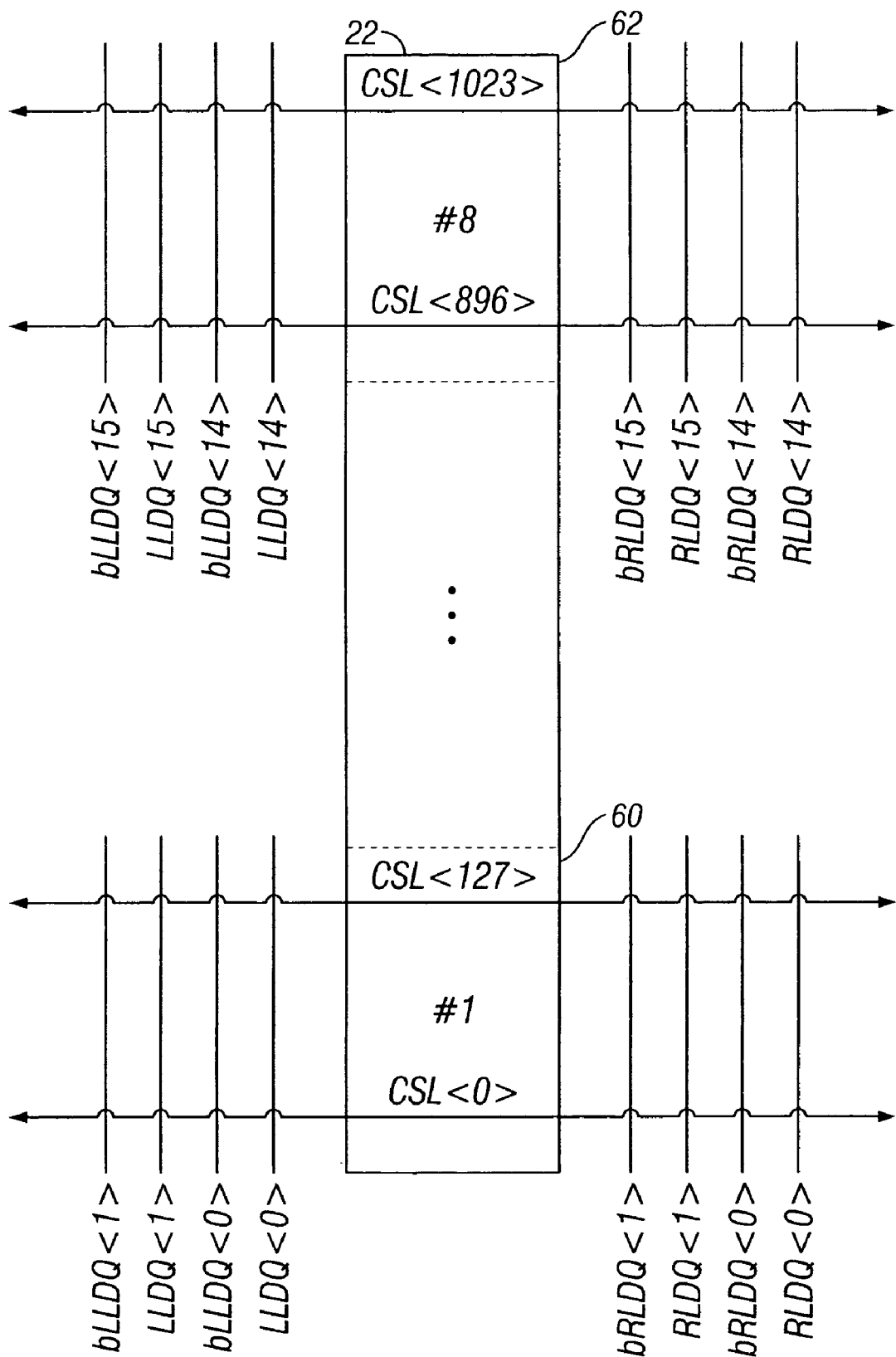
FIG. 4 is a block diagram illustrating a preferred arrangement of the 4 Mb memory section of FIG. 2 into memory eighths.

FIG. 4 is a block diagram illustrating a preferred arrangement of the 4 Mb memory section 22 of FIG. 2 into memory portions of the DRAM array 22 referred to as memory eighths 60, 62. Each memory eighth 60, 62 has 512 Kilobits ("Kb") of memory, where one Kilobit is $2^{10}$ bits or 1024 bits. Each memory eighth 60, 62 includes 128 CSLs and eight LDQs. For example, with reference to FIGS. 3 and 4, the lowest memory eighth 60, memory eighth #1, is traversed by CSL<0> to CSL<127>. The even-numbered LBLs 28 of memory eighth #1 60 all connect to LLDQ<0> and the odd-numbered LBLs 28 of memory eighth #1 60 all connect to LLDQ<1> through pass transistors 50. Similarly, even-numbered RBLs 24 of memory eighth #1 60 all connect to RLDQ<0> and the odd-numbered RBLs 24 of memory eighth #1 60 all connect to RLDQ<1> through pass transistors 50. The complementary bitlines 26, 30 connect to the bLDQs with the corresponding association of even-and odd-numbering.

Also, the highest memory eighth 62 of the 4 Mb memory section 22, memory eighth #8, is traversed by CSL<896> to CSL<1023>. The even-numbered LBLs 28 of memory eighth #8 62 all connect to LLDQ<14> and the odd-numbered LBLs 28 of memory eighth #8 62 all connect to LLDQ<15> through pass transistors 50. Similarly, even-numbered RBLs 24 of memory eighth #8 62 all connect to RLDQ<14> and the odd-numbered RBLs 24 of memory eighth #8 62 all connect to RLDQ<15> through pass transistors 50. In this manner, each memory eighth 60, 62 has four independent LDQs and four independent bLDQs. As described above, activating one CSL 52 and one WL 40 in the memory section 22 provides access to four memory cells 10 for reading or writing. In a preferred embodiment, four CSLs 52 and one WL 40 are activated simultaneously in the 4 Mb memory section 22, in non-adjacent memory eighths 60, 62, to provide access to a total of sixteen memory cells 10, termed the "x16" operational mode for the DRAM integrated circuit by those of ordinary skill in the art.

Figure 5:
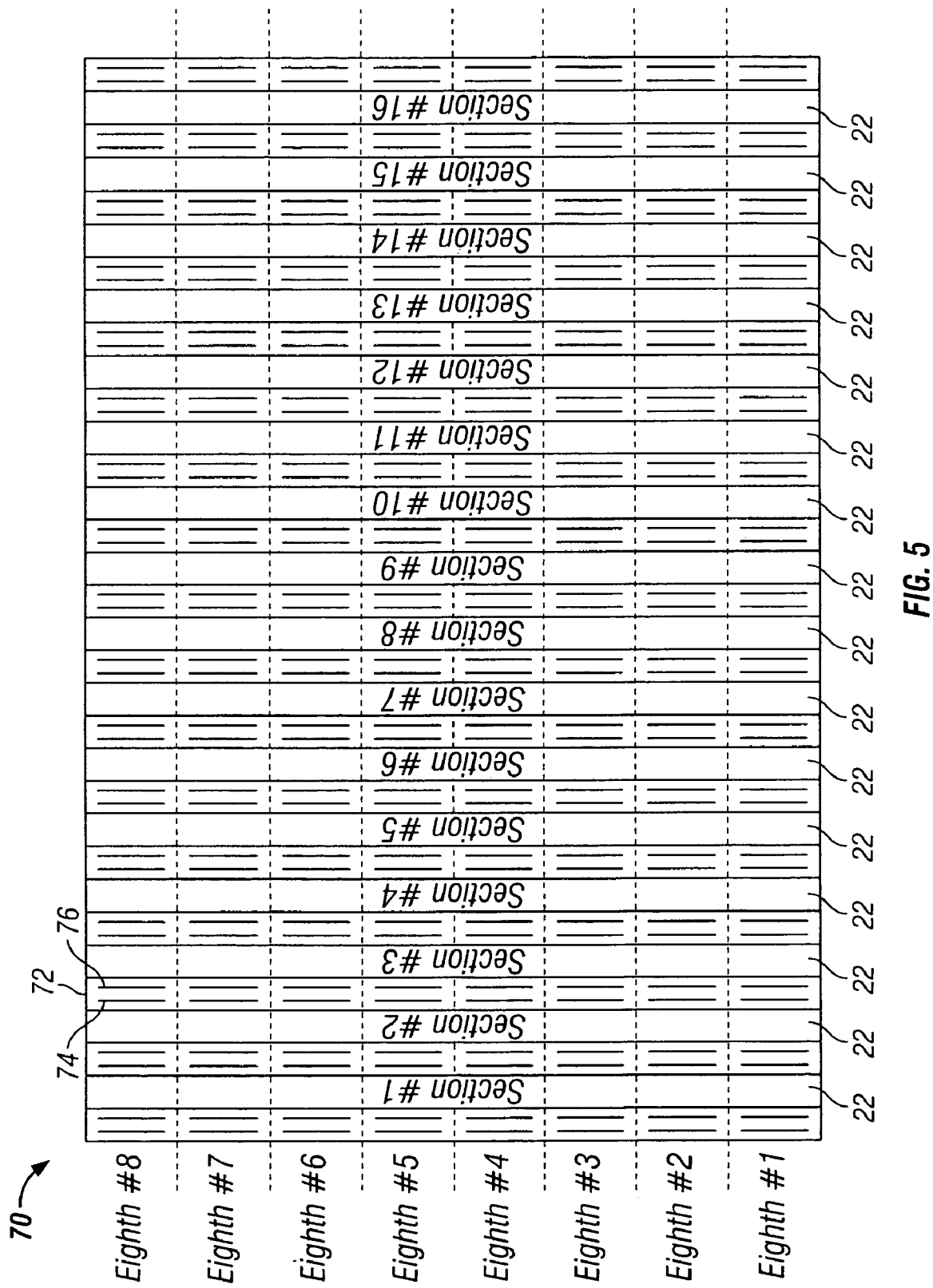
FIG. 5 is a block diagram illustrating a preferred arrangement of the 4 Mb memory sections of FIG. 2 in a 64 Mb DRAM array.

FIG. 5 is a block diagram illustrating a preferred arrangement of the 4 Mb memory sections 22 of FIG. 2 in a 64 Mb DRAM array 70. There are sixteen 4 Mb memory sections 22, each comprising eight memory eighths 60, 62. Between the memory sections 22 are sense amplifier areas 72 of the DRAM integrated circuit containing the sense amplifiers 32, 34, the LDQs, and the bLDQs. As described above, adjacent memory sections 22 share sense amplifiers 32, 34. For example, the LBLs 28 and bLBLs 30 of memory section #3 share sense amplifiers 32, 34 in the sense amplifier area 72 with the respective RBLs 24 and bRBLs 26 of memory section #2. Put another way, the left sense amplifiers 34 of memory section #3 are also the right sense amplifiers 32 of memory section #2.

Additionally, adjacent memory sections 22 share LDQs and bLDQs. As with the sharing of sense amplifiers 32, 34, sharing LDQs and bLDQs presents no ambiguity provided that memory eighths 60, 62 in adjacent memory sections 22 are not accessed simultaneously. For example, with reference to FIGS. 4 and 5, the LDQ<15> 74 is both the RLDQ<15> of memory section #2 and the LLDQ<15> of memory section #3. Similarly, the LDQ<14> 76 is both the RLDQ<14> of memory section #2 and the LLDQ<14> of memory section #3. Accompanying LDQ<15> 74 and LDQ<14> in the sense amplifier area 72 between memory sections #2 and #3 are complementary LDQs, bLDQ<15> and bLDQ<14> (not shown). The sharing of sense amplifiers 32, 34 and LDQs reduces the number of components and LDQs in the sense amplifier area 72, resulting in a saving of space on the die of the DRAM integrated circuit.

The CSLs 52 traverse the entire DRAM array 70 and each CSL 52 connects to the gates of eight pass transistors 50 in each memory section 22. In each memory section 22, the common CSL 52 connects four bitlines 24, 28 to four LDQs through pass transistors 50, and connects four complementary bitlines 26, 30 to four bLDQs through another four pass transistors 50 as depicted in FIG. 3. Thus, for example and with reference to FIGS. 4 and 5, activating CSL<1023> connects LBL<2046> of memory section #3 and RBL<2046> of memory section #2 through pass transistors 50 to LDQ<14> 76 in the sense amplifier area 72 between the memory sections. Activating CSL<1023> also connects LBL<2047> of memory section #3 and RBL<2047> of memory section #2 through pass transistors 50 to LDQ<15> 74. Activating CSL<1023> also connects the corresponding bLBLs 30 and bRBLs 26 to bLDQ<14> and bLDQ<15>.

In operation, as described above, a read/write operation on the 64 Mb DRAM array 70 activates four CSLs 52, one per non-adjacent memory eighth 60, 62. Typically, the read/write operation activates one CSL 52 in each odd-numbered memory eighth 60, or alternatively one CSL 52 in each even-numbered memory eighth 62. An example of the former is the activation of CSL<0> in memory eighth #1, CSL<256> in memory eighth #3, CSL<512> in memory eighth #5, and CSL<768> in memory eighth #7.

The read/write operation for the 64 Mb DRAM array 70 also activates two WLs 40. One WL 40 is activated in the left memory sections 22 of the DRAM array 70, memory sections #1–#8, and a corresponding WL 40 is activated in the right memory sections 22 of the DRAM array 70, memory sections #9–#16. For example, activating WL<3> in memory section #2 may be accompanied by the activation of WL<3> in memory section #10. Because activating one WL 40 and one CSL 52 provides access to four memory cells 10, it follows that activating two WLs 40 and four CSLs 52 provides access to 32 memory cells 10, corresponding to 32 bits of data in this preferred embodiment, termed the "x32" operational mode for the DRAM integrated circuit by those of ordinary skill in the art. Whereas operation of the 4 Mb section 22 was in the x16 mode, operation of the 64 Mb DRAM array 70 comprising sixteen 4 Mb sections 22 as depicted in FIG. 5 is in the x32 mode.

It should be understood, however, that other operational modes are possible such as x8 and x4 operational modes and that the present invention is not limited to DRAM arrays 20, 70 in the x32 or x16 operational mode but may also apply to DRAM arrays 20, 70 in the x8 or x4 operational mode. The x4 mode corresponds to opening one WL 40 and one CSL 52 in the DRAM array 20, 70, whereas the x8 operational mode corresponds to opening one WL 40 and two CSLs 52 in the DRAM array 20, 70.

Figure 6:
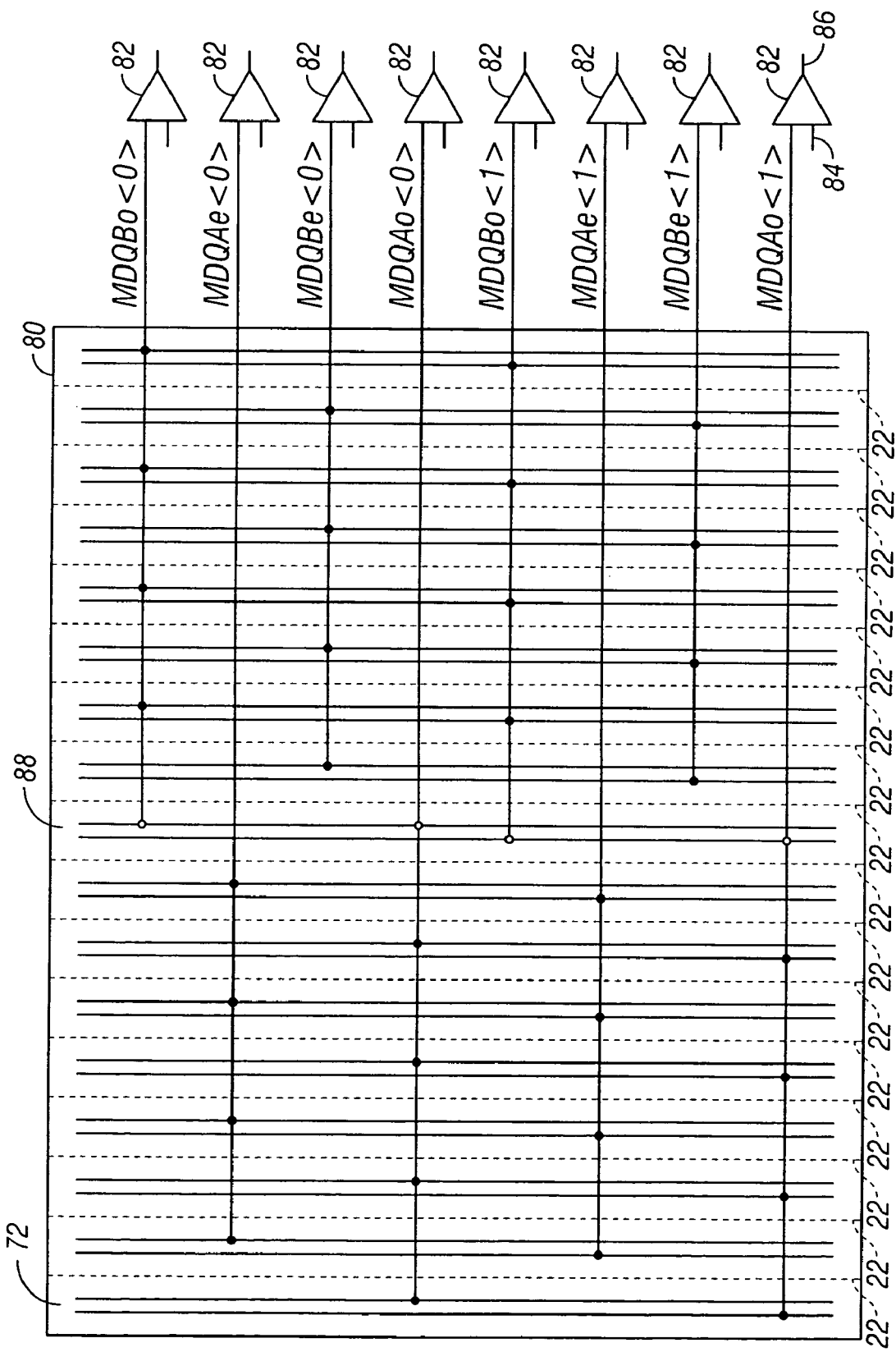
FIG. 6 is a diagram illustrating connections between the local data lines of and corresponding master data lines of a memory eighth of FIG. 4.

FIG. 6 is a diagram illustrating connections between the LDQs 74, 76 and corresponding master data lines ("MDQs") of a memory eighth 80, and with secondary sense amplifiers ("SSAs") 82. Each dot in FIG. 6 represents a connection between a LDQ 74, 76 and a MDQ. The memory eighth 80 also includes connections between the shared bLDQs (not shown) and complementary master data lines ("bMDQs") (not shown).

The memory eighth 80, for example memory eighth #1 of FIG. 5, contains the lower memory eighth 60 of memory sections 22 #1 to #16. The memory eighth 80 also has seventeen sense amplifier areas 72, each with two LDQs and two bLDQs (not shown). Each MDQ connects unambiguously to four LDQs in alternate sense amplifier areas 72 in the memory eighth 80. Also, each bMDQ connects unambiguously to four bLDQs in alternate sense amplifier areas 72. As is known in the art, the MDQ to LDQ connections in the overlap sense amplifier area 88 between memory sections #8 and #9 are switched, as indicated by the open circle, to prevent two MDQs connecting simultaneously to the same LDQ in the overlap sense amplifier area 88. A similar switching occurs for the bMDQ to bLDQ connections in the overlap sense amplifier area 88.

As only one WL 40 is activated in the left memory sections 22 #1 to #8 of the DRAM array 80, the "A sections," and only one WL 40 is activated in the right memory sections 22 #9 to #16 of the DRAM array 80, the "B sections," when a CSL 52 in the memory eighth 80 is activated then either eight LDQs are unambiguously connected to bitlines 24, 28, or eight bLDQs are unambiguously connected to complementary bitlines 26, 30.

As each MDQ connects unambiguously to one LDQ, and each bMDQ connects unambiguously to one bLDQ, then eight memory cells 10 are connected to either a respective MDQ or bMDQ. With reference to FIG. 6, the MDQs are connected to one input of the SSAs 82 and the corresponding bMDQs are connected to the other input 84 of the SSAs 82. By amplifying the potential difference between the MDQ and corresponding bMDQ, which are themselves connected to a bitline 24, 28 and its complementary bitline 26, 30, the output 86 of the SSA 82 provides a voltage representing the logic data value stored in the memory cell 10. This is a read operation.

Therefore, eight memory cells 10 are connected to the eight SSAs 82 to read eight bits of data from the memory eighth 80 along the MDQs. In the x32 operational mode described above, four CSLs 52 are activated, one in each odd-numbered memory eighth 60 or one in each even-numbered memory eighth 62. In this manner, thirty-two bits are read out of the 64 Mb DRAM array 70 along the MDQs or bMDQs during the same read cycle.

Alternatively, when the pass transistors 50 are conducting, a MDQ or bMDQ may be raised to $V_{CC}$ to write a logic value of one to a corresponding memory cell 10 or lowered to zero potential to write a logic value of zero through the bitlines and complementary bitlines connected to the MDQs and bMDQs. As a single wordline activates the memory cells 10 connected to either bitlines or complementary bitlines, as can be seen with reference to FIG. 2, the configuration depicted in FIG. 3 writes four bits to the memory section 22 during the activation of one CSL 52 and one WL 40. In the x32 operational mode described above, four CSLs 52 are activated, one in each odd-numbered memory eighth 60 or one in each even-numbered memory eighth 62. In this manner, thirty-two bits are written into the 64 Mb DRAM array 70 along the MDQs or bMDQs during the same write cycle.

Read-Write Data Lines

Figure 7:
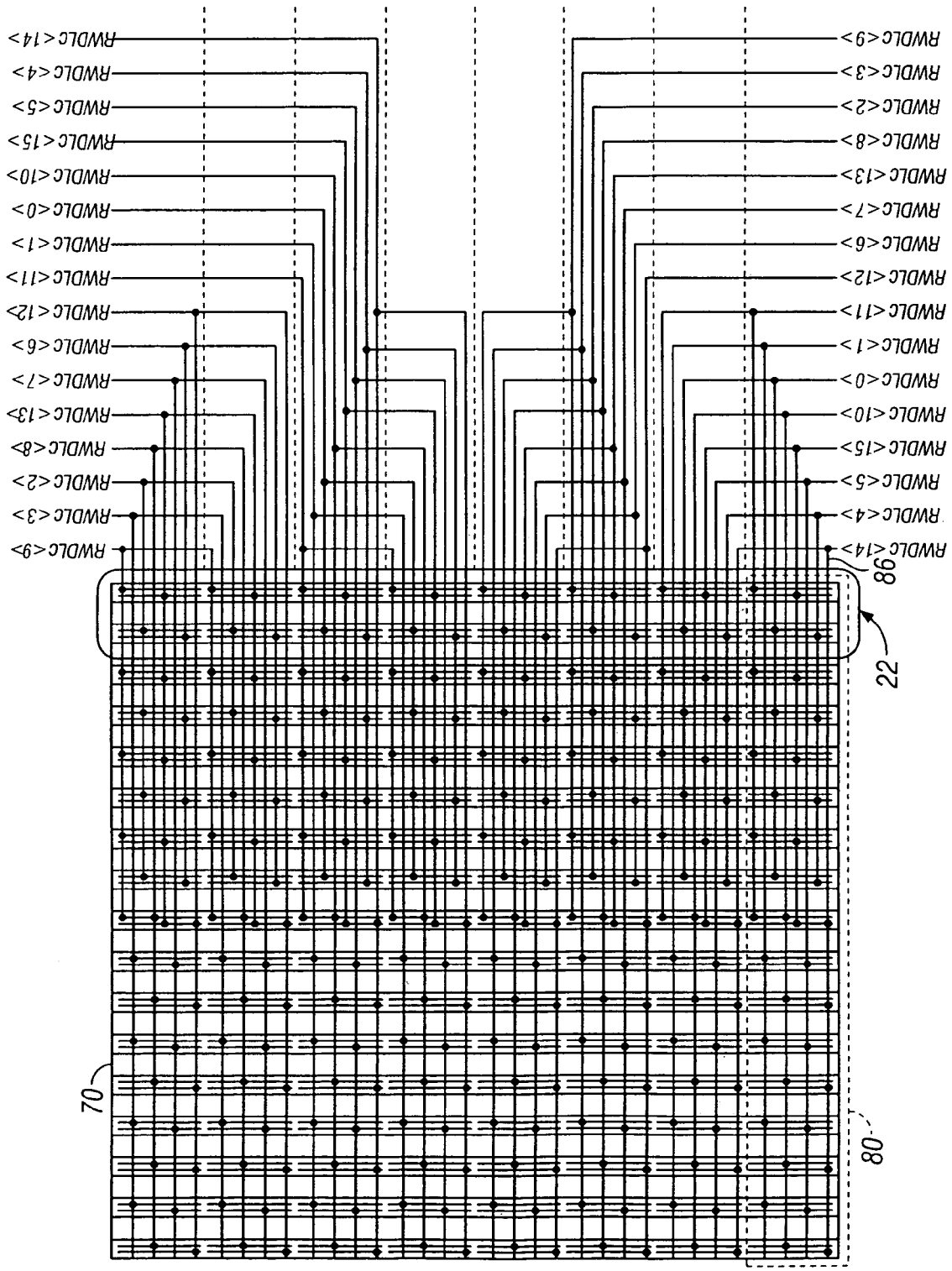
FIG. 7 is a diagram illustrating connections between the master data lines and corresponding read-write data lines of the 64 Mb DRAM array of FIG. 5.

FIG. 7 is a diagram illustrating connections between the master data lines and corresponding read-write data lines of the 64 Mb DRAM array 70 of FIG. 5. FIG. 7 shows a memory section 22 of FIGS. 4 and 5, in this case memory section 22 #16, positioned within the DRAM array 70. FIG. 7 also shows a memory eighth 80 of FIGS. 4 and 6, in this case the first memory eighth 60, positioned within the DRAM array 70.

The connections between the LDQs and MDQs for each memory eighth 80 are shown as dots, corresponding to the connections shown in FIG. 6. The corresponding connections between the bLDQs and bMDQs are not shown. Also not shown in FIG. 7 are the SSAs 82 which compare the potential difference between and MDQ and corresponding bMDQ or the drivers that input potentials to the MDQs and bMDQs.

The input/outputs of the data paths 86 to/from the DRAM array 70 are shown in FIG. 7 as connecting to read-write data lines ("RWDLs"). Eight RWDLs connect to the outputs of the eight SSAs 82 of each memory eighth 60, 80 and connect to the inputs of the MDQs and bMDQs. As discussed above, activating two WLs 40 and one CSL 52 in a memory eighth 80 reads out eight bits from the memory eighth 80 along the data path 86 or writes in eight bits. During a read operation, these bits correspondingly appear on the eight RWDLs that connect to the outputs of the SSAs 22 for the memory eighth 80. Similarly, the RWDLs connect to the MDQs and bMDQs through drivers (not shown) for writing eight bits to the memory eighth 80.

Moreover, as discussed above, four CSLs 52 for the DRAM array 70, one CSL 52 in each alternating memory eighth 60, are activated during the read cycle (and similarly during a write cycle). Therefore adjacent memory eighths 80 are not activated during the same read cycle. As each activated memory eighth 80 reads or writes eight bits and four memory eighths 80 are activated, the DRAM array 70 outputs thirty-two bits to the thirty-two RWDLs or stores thirty-two bits from the thirty-two RWDLs.

The data path 86 of each memory portion consisting of a pair of adjacent memory eighths 80 connect to the same RWDLs as shown in FIG. 7. As only one of each pair of memory eighths 80 is activated in the memory portion during the same read or write cycle, no ambiguity arises from sharing RWDLs as shown in FIG. 7.

Spare Column Select Lines

An ambiguity does arise, however, when repairing the DRAM array 70 by using spare CSLs 52. Each memory portion, such as a memory eighth 80, includes a number of spare memory cells 10, which can substitute as replacements for memory cells 10 that are damaged either during the DRAM fabrication procedure or during packaging. Typically, the spare memory cells 10 are arranged in the same manner as the other memory cells 10 of FIG. 2 for the DRAM array 70 connected to spare bitlines 24, 28 and spare complementary bit lines 26, 30. Pass transistors 50 connect the spare bitlines 24, 28 and spare complementary bitlines 26, 30 to the LDQs and bLDQs for each section 22 of the DRAM array 70 in the same manner as in FIG. 3. The gates of the pass transistors 50 associated with the spare bitlines 24, 28 and spare complementary bitlines 26, 30 for each section 22 connect to a common spare CSL 52 ("SCSL") that traverses all sections 22 of the DRAM array 70. In a preferred embodiment, each memory eighth 80 includes four SCSLs 52 in addition to the 128 CSLs 52, although it should be understood that the memory portion may include more or fewer SCSLs 52.

Repairing defective memory cells 10 is typically performed during the process of manufacturing and testing the DRAM array 70. A testing circuit, which may either be internal or external to the DRAM integrated circuit, determines which memory cells 10 are defective. The testing circuit stores the addresses of the CSLs 52 associated with these defective memory cells 10. Programmable fuses on the DRAM integrated circuit are blown to record the addresses of the CSLs 52 associated with the defects. Later attempts to access a CSL 52 whose address was recorded results in a match of the address within the circuitry that contains the blown fuses. Instead of activating the defective CSL 52, the DRAM integrated circuit transfers access to a selected SCSL 52 that is designated as a substitute for the defective CSL 52.

In one embodiment, the selected SCSL 52 that substitutes for the defective CSL 52 in a particular memory eighth 80 is associated with the other memory eighth 80 in the pair of adjacent memory eighths 80 according to the structure illustrated in FIG. 7. The fuses are associated with the SCSLs 52. When a defective CSL 52 is detected by the testing circuit, a SCSL 52 in the adjacent memory eighth 80 is selected for that defective CSL 52. The fuses associated with the SCSL 52 are blown to record the address of the defective CSL 52. Thereafter, when the DRAM integrated circuit attempts to access that address, the SCSL 52 associated with that recorded address is activated and substitutes for the defective CSL 52. For example, repair of a defective CSL<76> in memory eighth 80 #1 may be achieved with a SCSL 52 in memory eighth 80 #2, say SCSL<5>. The fuses associated with SCSL<5> are blown to record the address of the defective CSL 52, seventy-six in this example.

In operation, there are several ways to effect the substitution. In one embodiment, instead of activating the defective CSL 52, the DRAM integrated circuit activates the SCSL 52 in the adjacent memory eighth 80. A match of the address that the DRAM attempts to access with the address stored by the blown fuses activates the SCSL 52 associated with these blown fuses. At the same time, the defective CSL 52 is not activated. In an alternative embodiment, the DRAM integrated circuit activates both the defective CSL 52 and the SCSL 52 but disables the SSAs 82 associated with the memory eighth 80 containing the defective CSL 52. At the same time, the DRAM integrated circuit enables the SSAs 82 in the adjacent memory eighth 80 that includes the SCSL 52. The corrupted data from the memory cells 10 associated with the defective CSL 52 still appears on the respective MDQs but is prevented from appearing on the RWDLs. In either embodiment, as the pair of adjacent memory eighths 80 share RWDLs, the eight bits retrieved from the DRAM array 22 due to the activation of the SCSL 52 appear on the same set of RWDLs as would have the eight bits from the defective CSL 52.

In particular, with reference to FIGS. 5 and 7, defective CSLs 52 in memory eighth 80 #1 are repaired using the SCSLs 52 of memory eighth 80 #2 and vice versa. Defective CSLs 52 in memory eighth 80 #3 are repaired using the SCSLs 52 of memory eighth 80 #4 and vice versa. Defective CSLs 52 in memory eighth 80 #5 are repaired using the SCSLs 52 of memory eighth 80 #6 and vice versa. And defective CSLs 52 in memory eighth 80 #7 are repaired using the SCSLs 52 of memory eighth 80 #8 and vice versa.

Multiplexing Data Lines

A problem occurs, however, when there are more defective CSLs 52 in a memory eighth 80 than there are SCSLs 52 in the adjacent memory eighth 80. In this case there are too few SCSLs 52 in the adjacent memory eighth 80 to substitute for all of the defective CSLs 80. With the connections between the data paths 86 and corresponding RWDLs as shown in FIG. 7, the inability to substitute for all of the defective CSLs 80 in any of the memory eighths 80 renders the DRAM integrated circuit unusable.

Figure 8:
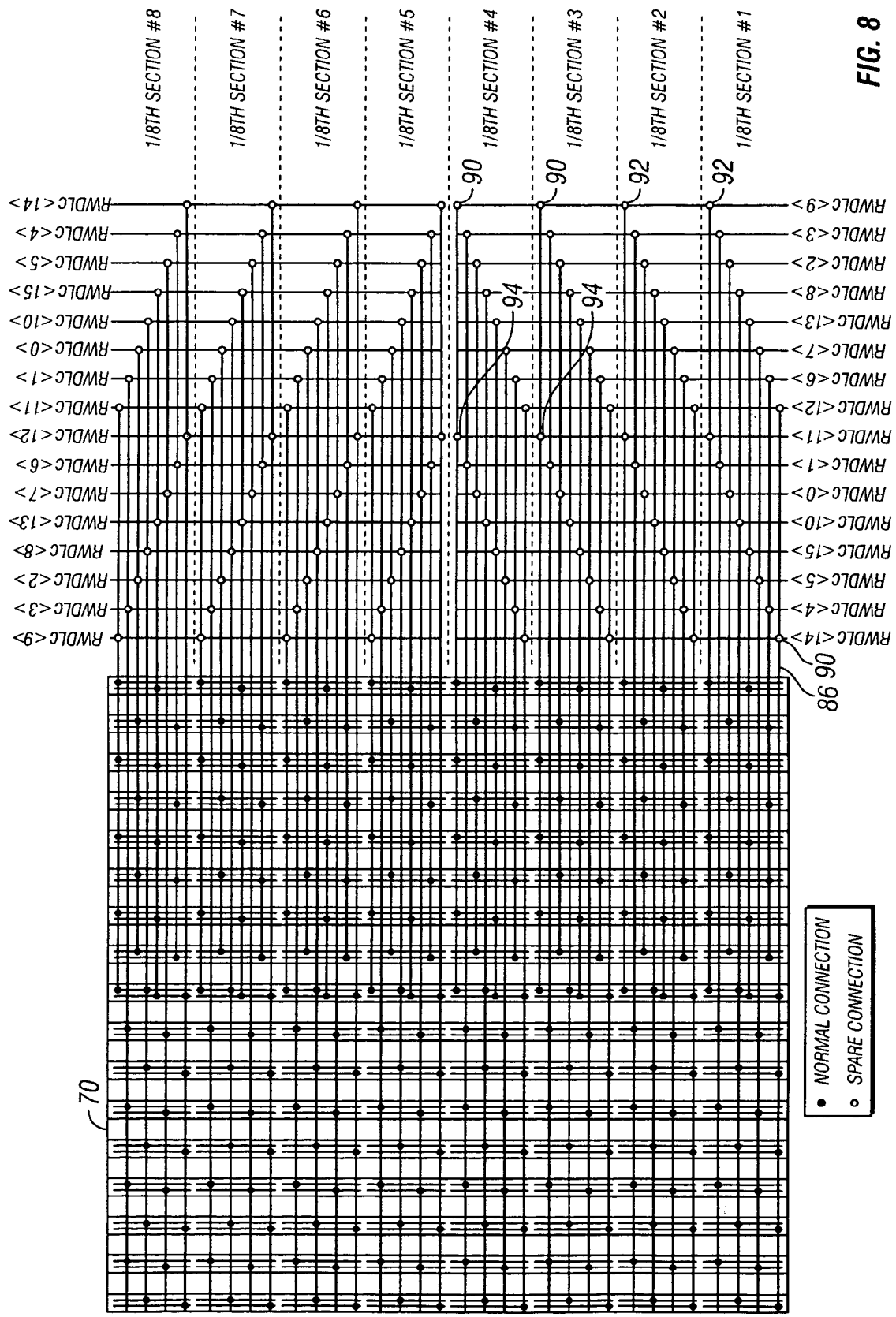
FIG. 8 is a diagram illustrating multiplexed connections between the master data lines and the corresponding read-write data lines of the 64 Mb DRAM array of FIG. 5.

FIG. 8 is a diagram illustrating multiplexed connections between the master data lines and corresponding read-write data lines of the 64 Mb DRAM array 70 of FIG. 5. In FIG. 8, the connections between the LDQs and MDQs for each memory eighth 80 are shown as dots, as they were in FIG. 7. The corresponding connections between the bLDQs and bMDQs are not shown. Also not shown in FIG. 8 are the SSAs 82 which compare the potential difference between and MDQ and corresponding bMDQ and the drivers.

The data path outputs 86 of the SSAs 82 for reading, or equivalently the data path 86 inputs to the MDQs and bMDQs for writing, are shown in FIG. 8 as connecting to the RWDLs through "normal" connections 90 indicated as filled squares. The normal connections 90 are arranged in the same manner as the connections between the data paths 86 and RWDLs shown in FIG. 7. A memory portion comprising adjacent memory eighths 80 share RWDLs, such as memory eighths 80 #1 and #2. As only one memory eighth 80 of the memory portion is activated at a time, the data on the RWDLs is unambiguously associated with the activated memory eighth 80. Through the normal connections 90, a SCSL 52 in a memory eighth 80, and the memory cells 10 associated with the SCSL 52, may substitute for a CSL 52 associated with damaged or defective memory cells 10 in the adjacent memory eighth 80 as was described above with respect to FIG. 7.

In addition to the normal connections 90, FIG. 8 also shows the data paths 86 connecting to additional RWDLs through "spare" connections 92, 94 indicated as open squares. In one embodiment, as shown in FIG. 8, the lower left eight RWDLs connect to the data paths 86 of memory eighth 80 sections #1 and #2 through the normal connections 90. The same lower left eight RWDLs, however, connect to the data paths 86 of memory eighth 80 sections #3 and #4 through the spare connections 94. Also, the lower right eight RWDLs connect to the data paths 86 of memory eighth 80 sections #3 and #4 through the normal connections 90. The same lower right eight RWDLs, however, connect to the data paths 86 of memory eighth 80 sections #1 and #2 through the spare connections 92.

In the data path output 86 for each memory eighth 80, only one of the normal 90 or spare 92 connections are active at any one time. For example, either the lower left eight RWDLs connect to the data path output 86 of memory eighth 80 #1 through the normal connections 90 or the lower right eight RWDLs connect to the data path output 86 of memory eighth 80 #1 through the spare connections 92. Additionally, the activation of normal 90 or spare 92 connections may be done independently for the data path output 86 of each memory eighth 80.

With this arrangement, a SCSL 52 in memory eighth 80 #4, and the memory cells 10 associated with the SCSL 52, may substitute for a CSL 52 associated with damaged or defective memory cells 10 in the memory eighth 80 #1. In the configuration of FIG. 7, eight bits retrieved from the SCSLs 52 of memory eighth 80 #2 may appear on the same set of RWDLs as would have those from the activation of the defective CSL 52 of memory eighth 80 #1. In the configuration of FIG. 8, however, eight bits retrieved from the SCSLs 52 of memory eighth 80 #2 or #4 may appear on the same set of RWDLs as the defective CSL 52 of memory eighth 80 #1.

Whether the SCSLs 52 of memory eighth 80 #2 or #4 substitute for the defective CSL 52 of memory eighth 80 #1 is conditioned on whether the lower left RWDLs connect to the outputs 86 of the SSAs 82 through the normal 90 or spare 94 connections respectively. For example, if the normal connections 90 of memory eighths 80 #1 to #4 are active, the SCSLs 52 of memory eighth 80 #2 may substitute for defective CSLs 52 in memory eighth 80 #1, as described above in relation to FIG. 7. Alternatively, if the normal connections 90 of memory eighths 80 #1 and #3 are active and the spare connections 94 of memory eighths 80 #2 and #4 are active, the SCSLs 52 of memory eighth 80 #4 may substitute for defective CSLs 52 in memory eighth 80 #1.

As may be also understood from FIG. 8, defective CSLs 52 in memory eighth 80 #1 may be repaired using the SCSLs 52 of memory eighth 80 #4 and vice versa. Defective CSLs 52 in memory eighth 80 #2 may be repaired using the SCSLs 52 of memory eighth 80 #3 and vice versa. Defective CSLs 52 in memory eighth 80 #5 may be repaired using the SCSLs 52 of memory eighth 80 #8 and vice versa. And defective CSLs 52 in memory eighth 80 #6 may be repaired using the SCSLs 52 of memory eighth 80 #7 and vice versa. In contrast to FIG. 7 where only four CSLs 52 in a memory eighth 80 could be repaired with SCSLs 52 in the adjacent memory eighth 80, the multiplexed connections of FIG. 8 allow for eight CSLs 52 to be repaired in a memory eighth 80.

Figure 9:
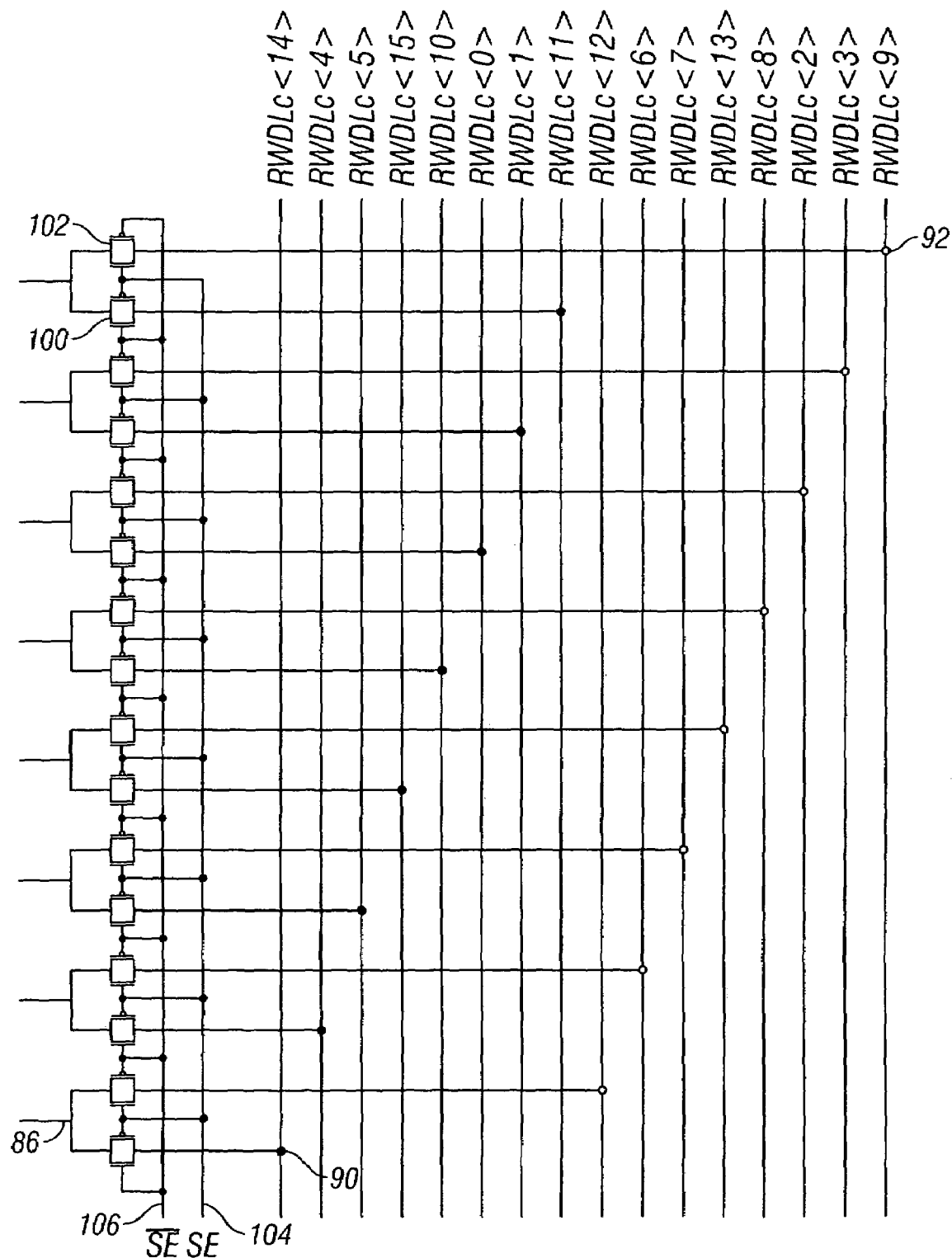
FIG. 9 is a circuit diagram illustrating the normal connections and spare connections of the outputs of the secondary sense amplifiers to the read-write data lines of FIG. 8.

FIG. 9 is a circuit diagram illustrating the normal connections 90 and spare connections 92, 94 of each of the data paths 86 to the RWDLs of FIG. 8. For example, FIG. 9 shows transmission gates 100, 102 connecting the data path 86 of the memory eighth 80 section #1 to the lower sixteen RWDLs of FIG. 8. Whether the data path 86 connects to the left eight RWDLs or right eight RWDLs is dependent on the conducting state of the transmission gates 100, 102. As described above, the connections 90–94 for each memory eighth 80 are independent.

As is known to those of ordinary skill in the art, a transmission gate 100, 102 includes a pair of N-type and P-type transistors that have their respective drains and sources connected. A positive voltage (such as $V_{CC}$) on the gate of the N-type transistor and grounding of the gate of the P-type transistor opens the transmission gate for conduction. When the spare enable ("SE") line 104 is grounded (and its corresponding complementary line ("$\overline{SE}$") 106 is at the positive voltage), the transmission gates 100 associated with the normal connections 90 conduct, and the transmission gates 102 associated with the spare connections 92 do not conduct. In this manner, the data path 86 connects to the left eight RWDLs. Similarly, when the SE line is at the positive voltage and the complementary line is grounded, the data path 86 connects to the right eight RWDLs. These switching circuits transfer the output of the data path 86 from memory eighth 80 #1 between the left and right eight RWDLs. It should be understood, however, that the switching circuits are not limited to the transmission gates 100, 102 depicted in FIG. 9 and that other switching circuits may be provided, such as those based on transistors or other solid state devices.

As described above, the connections 90–94 for each memory eighth 80 are independent. Correspondingly, there is an independent SE line 104 associated with each memory eighth 80. With reference to FIG. 8, the lower left RWDLs connect to data paths 86 for the memory portion of adjacent memory eighths 80 #1 and #2 when the SE lines 104 associated with memory eighths 80 #1 and #2 are at zero potential. The data paths 86 connect by conduction through the forwardly biased transmission gates 100, corresponding to the normal connections 90. Similarly, the lower right RWDLs connect by conduction through forwardly biased transmission gates 100 to the data paths 86 for the memory portion of memory eighths 80 #3 and #4. In this manner, SCSLs 52 in memory eighth 80 #2 may repair defective CSLs 52 in memory eighth 80 #1 and vice versa as the memory eighths share the same RWDLs. Also, SCSLs 52 in memory eighth 80 #4 may repair defective CSLs 52 in memory eighth 80 #3 and vice versa.

When the SE lines 104 associated with memory eighths 80 #2 and #4 are at the positive potential, however, the lower left RWDLs connect to data paths 86 for the memory portion of memory eighths 80 #1 and #4. The data paths 86 of memory eighth #4 connect by conduction through the other transmission gates 102, which are now forwardly biased, corresponding to the spare connections 94 for memory eighth #4. Similarly, the lower right RWDLs connect by conduction through forwardly biased transmission gates 102 of the other spare connections 92 to the data paths 86 for memory eighth 80 #2. In this manner, SCSLs 52 in memory eighth 80 #4 may repair defective CSLs 52 in memory eighth 80 #1 and vice versa as the memory eighths share the same RWDLs. Also, SCSLs 52 in memory eighth 80 #2 may repair defective CSLs 52 in memory eighth 80 #3 and vice versa.

It should be understood, however, that the present invention is not limited to DRAM arrays 70 in the x32 operational mode but may also apply to DRAM arrays 70 in the x16, x8, or x4 operational mode. For example, in both the x16 and x8 operational modes, defective CSLs 52 in memory eighth 80 #1 may be repaired using the SCSLs 52 of memory eighth 80 #3 and vice versa. Defective CSLs 52 in memory eighth 80 #2 may be repaired using the SCSLs 52 of memory eighth 80 #4 and vice versa. Defective CSLs 52 in memory eighth 80 #5 may be repaired using the SCSLs 52 of memory eighth 80 #7 and vice versa. And defective CSLs 52 in memory eighth 80 #6 may be repaired using the SCSLs 52 of memory eighth 80 #8 and vice versa.

Additionally, it should be appreciated that the multiplexing system described above scales with the number of RWDLs and the number of CSLs 52. For example, DRAM integrated circuits that operate in x64, x128 and higher operational modes may employ the above-described normal 90 and spare 92 connections to increase the number of SCSLs 52 that may substitute for a damaged CSL 52 by permitting access to the SCSLs 52 in other memory portions.

The foregoing detailed description is merely illustrative of several embodiments of the invention. Variations of the described embodiments may be encompassed within the purview of the claims. More or fewer elements or components may be used in the block diagrams. Accordingly, any description of the embodiments in the specification should be used for general guidance, rather than to unduly restrict any broader descriptions of the elements in the following claims.

We claim:

1. A system of multiplexed data lines in a DRAM integrated circuit, comprising:
   (a) a switching circuit having a first switching state and a second switching state;
   (b) a first data path associated with a first memory portion of the DRAM integrated circuit, the first data path comprising a first plurality of master data lines for the first memory portion of the DRAM integrated circuit;
   (c) a second data path associated with a second memory portion of the DRAM integrated circuit, the second data path comprising a second plurality of master data lines for the second memory portion of the DRAM integrated circuit;
   (d) a plurality of read-write data lines of the DRAM integrated circuit, wherein the first data path is in communication with the plurality of read-write data lines when the switching circuit is in the first switching state, and wherein the second data path is in communication with the plurality of read-write data lines when the switching circuit is in the second switching state;
   (e) a first plurality of transmission gates between the first data path and the plurality of read-write data lines, wherein the first plurality of transmission gates conduct in the first switching state and do not conduct in the second switching state; and
   (f) a second plurality of transmission gates between the second data path and the plurality of read-write lines, wherein the second plurality of transmission gates conduct in the second switching state and do not conduct in the first switching state.

2. The system of claim 1, wherein the first plurality of transmission gates conduct and the second plurality of transmission gates do not conduct in response to an enable signal.

3. The system of claim 1, wherein the first plurality of transmission gates do not conduct and the second plurality of gates conduct in response to an inverse of the enable signal.

4. The system of claim 1, further comprising:
   (e) another plurality of read-write data lines of the DRAM integrated circuit, wherein the other plurality of read-write data lines is in communication with the second data path when the switching circuit is in the first switching state, and wherein the other plurality of read-write data lines is in communication with the first data path when the switching circuit is in the second switching state.

5. The system of claim 4, wherein the switching circuit further comprises:
   (a3) a third plurality of transmission gates between the second data path and the other plurality of read-write data lines, wherein the third plurality of transmission gates conduct in the first switching state and do not conduct in the second switching state; and
   (a4) a fourth plurality of transmission gates between the first data path and the other plurality of read-write data lines, wherein the fourth plurality of transmission gates conduct in the second switching state and do no conduct in the first switching state.

6. A system of multiplexed data lines in a DRAM integrated circuit, comprising:
   (a) a switching circuit having a first switching state and a second switching state;
   (b) a first data path associated with a first memory portion of the DRAM integrated circuit;
   (c) a second data path associated with a second memory portion of the DRAM integrated circuit;
   (d) a plurality of read-write data lines of the DRAM integrated circuit, wherein the first data path is in communication with the plurality of read-write data lines when the switching circuit is in the fist switching state, and wherein the second data path is in communication with the plurality of read-write data lines when the switching circuit is in the second switching state; and
   (e) another plurality of read-write data lines of the DRAM integrated circuit, wherein the other plurality of read-write data lines is in communication with the second data path when the switching circuit is in the first switching state, and wherein the other plurality of read-write data lines is in communication with the first data path when the switching circuit is in the second switching state.

7. The system of claim 6, wherein the switching circuit comprises:
   (a1) a first plurality of transmission gates between the first data path and the plurality of read-write data lines, wherein the first plurality of transmission gates conduct in the first switching state and do not conduct in the second switching state; and
   (a2) a second plurality of transmission gates between the second data path and the plurality of read-write lines, wherein the second plurality of transmission gates conduct in the second switching state and do not conduct in the first switching state.

8. The system of claim 7, wherein the first plurality of transmission gates conduct and the second plurality of transmission gates do not conduct in response to an enable signal.

9. The system of claim 7, wherein the first plurality of transmission gates do not conduct and the second plurality of gates conduct in response to an inverse of the enable signal.

10. The system of claim 6, wherein (b) and (c) comprise:
   (b1) a first plurality of master data lines for the first memory portion of the DRAM integrated circuit; and
   (c1) a second plurality of master data lines for the second memory portion of the DRAM integrated circuit.

11. The system of claim 6, wherein the switching circuit further comprises:
   (a3) a third plurality of transmission gates between the second data path and the other plurality of read-write data lines, wherein the third plurality of transmission gates conduct in the first switching state and do not conduct in the second switching state; and
   (a4) a fourth plurality of transmission gates between the first data path and the other plurality of read-write data lines, wherein the fourth plurality of transmission gates conduct in the second switching state and do no conduct in the first switching state.

* * * * *